(12) United States Patent
Hattori et al.

(10) Patent No.: US 10,141,116 B2
(45) Date of Patent: *Nov. 27, 2018

(54) COMPOSITE ELECTRONIC COMPONENT AND RESISTOR DEVICE

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Shinichiro Kuroiwa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/460,265

(22) Filed: Mar. 16, 2017

(65) Prior Publication Data

US 2017/0278638 A1 Sep. 28, 2017

(30) Foreign Application Priority Data

Mar. 22, 2016 (JP) ................... 2016-057641

(51) Int. Cl.
*H01C 1/012* (2006.01)
*H01G 4/40* (2006.01)
(Continued)

(52) U.S. Cl.
CPC .............. *H01G 4/40* (2013.01); *H01C 1/012* (2013.01); *H01C 1/14* (2013.01); *H01G 2/06* (2013.01);
(Continued)

(58) Field of Classification Search
CPC .................. H01C 1/012; H01C 1/14
(Continued)

(56) References Cited

U.S. PATENT DOCUMENTS 3,790,870 A * 2/1974 Mitchell ................. H01L 29/84
257/417
5,179,366 A * 1/1993 Wagner ................. H01C 1/084
338/308

(Continued)

FOREIGN PATENT DOCUMENTS

JP 6-283301 A 10/1994
JP 07-254764 A 10/1995

(Continued)

OTHER PUBLICATIONS

Official Communication issued in corresponding Korean Patent Application No. 10-2017-0028913, dated Jan. 7, 2018.

(Continued)

*Primary Examiner* — Kyung Lee
(74) *Attorney, Agent, or Firm* — Keating & Bennett, LLP

(57) ABSTRACT

A composite electronic component includes a capacitor device and a resistor device disposed on one another in a heightwise direction. The capacitor device includes a capacitor body, a first external electrode, and a second external electrode. The resistor device includes a base portion, a resistor body, a first upper surface conductor, a second upper surface conductor, a first lower surface conductor, a second lower surface conductor, a first end surface connection conductor, and a second end surface connection conductor. An upper surface of the base portion of the resistor device faces a lower surface of the capacitor body of the capacitor device, the first upper surface conductor and the first external electrode are electrically connected, and the second upper surface conductor and the second external electrode are electrically connected.

20 Claims, 7 Drawing Sheets

(51) Int. Cl.
    *H01C 1/14*     (2006.01)
    *H01G 4/005*     (2006.01)
    *H01G 4/232*     (2006.01)
    *H01G 4/248*     (2006.01)
    *H01G 4/30*     (2006.01)
    *H01G 2/06*     (2006.01)
    *H05K 1/18*     (2006.01)

(52) U.S. Cl.
    CPC ............ *H01G 4/005* (2013.01); *H01G 4/232* (2013.01); *H01G 4/248* (2013.01); *H01G 4/30* (2013.01); *H05K 1/181* (2013.01)

(58) Field of Classification Search
    USPC ........................................................ 338/306
    See application file for complete search history.

(56) References Cited

U.S. PATENT DOCUMENTS

| | | | | |
|---|---|---|---|---|
| 2002/0014949 | A1* | 2/2002 | Tanaka | H01C 1/02 338/313 |
| 2006/0176675 | A1* | 8/2006 | Bourns | H01C 1/1406 361/780 |
| 2009/0108984 | A1* | 4/2009 | Choi | H01C 17/06533 338/22 R |
| 2010/0157505 | A1* | 6/2010 | Feichtinger | H01G 4/30 361/301.4 |
| 2010/0225439 | A1* | 9/2010 | Han | H01C 1/012 338/309 |
| 2013/0027155 | A1* | 1/2013 | Feichtinger | H01G 4/40 333/185 |
| 2013/0037911 | A1* | 2/2013 | Hattori | H01L 28/40 257/532 |
| 2014/0124256 | A1* | 5/2014 | Hattori | H01G 2/065 174/260 |
| 2015/0340154 | A1* | 11/2015 | Kim | H01G 2/14 174/260 |

FOREIGN PATENT DOCUMENTS

| | | |
|---|---|---|
| JP | 2001-338838 A | 12/2001 |
| KR | 10-2013-0018146 A | 2/2013 |
| KR | 10-2015-0135909 A | 12/2015 |

OTHER PUBLICATIONS

Hattori, K. et al., Composite Electronic Component and Resistor; U.S. Appl. No. 15/042,236, filed Feb. 12, 2016.

* cited by examiner

COMPOSITE ELECTRONIC COMPONENT AND RESISTOR DEVICE

CROSS REFERENCE TO RELATED APPLICATIONS

This application claims the benefit of priority to Japanese Patent Application No. 2016-057641 filed on Mar. 22, 2016. The entire contents of this application are hereby incorporated herein by reference.

BACKGROUND OF THE INVENTION

1. Field of the Invention

The present invention relates to a composite electronic component including a resistor device and a capacitor device, and a resistor device of a composite electronic component.

2. Description of the Related Art

Conventionally, various types of electronic components have been proposed as a composite electronic component including a resistor element (R) and a capacitor element (C) together from a viewpoint of high integration of electronic components on an interconnect substrate.

For example, Japanese Patent Laying-Open No. 2001-338838 discloses a composite electronic component in which a resistor body is provided on an external surface of a capacitor body of a chip type capacitor and the resistor body is connected to a pair of external electrodes provided on an external surface of the capacitor body so that a resistor element and a capacitor element are electrically connected.

Furthermore, Japanese Patent Laying-Open No. 6-283301 discloses a composite electronic component formed as follows: two or more types of identically shaped and equally dimensioned, rectangular parallelepiped chip type devices selected from a group of a chip type resistor, a chip type thermistor, a chip type capacitor and a chip type varistor, etc., are stacked on one another in their thickness direction and the terminal electrodes provided to them are collectively covered with a lead frame to integrate the chip type devices together.

However, the composite electronic component disclosed in Japanese Patent Laying-Open No. 2001-338838 has the resistor body formed directly on a surface of the capacitor body and accordingly, not only is a degree of difficulty in processing in producing the composite electronic component high but the resistor body will also have an electrical characteristic subject to constraints of the size of the capacitor body, the shape and size of the pair of external electrodes provided to the capacitor body, and the like, resulting in an extremely low degree of freedom in designing the composite electronic component.

Furthermore, the composite electronic component disclosed in Japanese Patent Laying-Open No. 6-283301 requires that the various types of chip type devices to be composited be each formed in an identically shaped and equally dimensioned rectangular parallelepiped, and accordingly, based on this, the individual chip type devices will also have their electrical characteristics subject to a constraint to a considerable extent, resulting in an extremely low degree of freedom in designing the composite electronic component.

Furthermore, the composite electronic components disclosed in Japanese Patent Laying-Open Nos. 2001-338838 and 6-283301 are both limited due to their structures to a configuration having a resistor element (R) and a capacitor element (C) connected electrically in parallel, and accordingly, a degree of freedom in designing them would also be significantly limited in a viewpoint of designing a circuit, and these composite electronic components will inevitably be limited in use to a particular circuit.

SUMMARY OF THE INVENTION

Preferred embodiments of the present invention provide a composite electronic component which is able to facilitate combining a resistor element and a capacitor element having desired electrical characteristics and is able to be more freely designed with an increased degree of design and manufacturing freedom, and a resistor device of the composite electronic component.

A composite electronic component according to a preferred embodiment of the present invention includes a resistor device and a capacitor device mounted on the resistor device in a heightwise direction. The resistor device includes an insulating base portion with an upper surface and a lower surface that are opposite to each other in the heightwise direction, and a pair of end surfaces that are opposite to each other in a lengthwise direction orthogonal or substantially orthogonal to the heightwise direction, a resistor body provided on the insulating base portion, a first upper surface conductor and a second upper surface conductor provided on the upper surface of the insulating base portion and separated from each other in the lengthwise direction, a first lower surface conductor and a second lower surface conductor provided on the lower surface of the insulating base portion and separated from each other in the lengthwise direction, a first end surface connection conductor provided on one of the pair of end surfaces of the insulating base portion and connecting the first upper surface conductor and the first lower surface conductor, a second end surface connection conductor provided on the other of the pair of end surfaces of the insulating base portion and connecting the second upper surface conductor and the second lower surface conductor, and a third lower surface conductor and a fourth lower surface conductor provided on the lower surface of the insulating base portion, located between the first lower surface conductor and the second lower surface conductor in the lengthwise direction, and separated from each other. The capacitor device includes a capacitor body including a lower surface orthogonal or substantially orthogonal to the heightwise direction, and a first external electrode and a second external electrode provided on an external surface of the capacitor body and separated from each other in the lengthwise direction. The upper surface of the insulating base portion and the lower surface of the capacitor body face each other in the heightwise direction, and the first upper surface conductor and the first external electrode are electrically connected to each other. The second upper surface conductor and the second external electrode are also electrically connected to each other. The resistor body is provided on the lower surface of the insulating base portion and located between the first lower surface conductor and the second lower surface conductor in the lengthwise direction. The third lower surface conductor and the fourth lower surface conductor are connected to the resistor body.

A resistor device according to a preferred embodiment of the present invention includes an insulating base portion including an upper surface and a lower surface that are opposite to each other in a heightwise direction, and a pair of end surfaces that are opposite to each other in a lengthwise direction orthogonal or substantially orthogonal to the heightwise direction, a resistor body provided on the insulating base portion, a first upper surface conductor and a second upper surface conductor provided on the upper surface of the insulating base portion and separated from each other in the lengthwise direction orthogonal or substantially orthogonal to the heightwise direction, a first lower surface conductor and a second lower surface conductor provided on the lower surface of the insulating base portion and separated from each other in the lengthwise direction, a first end surface connection conductor provided on one of the pair of end surfaces of the insulating base portion and connecting the first upper surface conductor and the first lower surface conductor, a second end surface connection conductor provided on the other of the pair of end surfaces of the insulating base portion and connecting the second upper surface conductor and the second lower surface conductor, and a third lower surface conductor and a fourth lower surface conductor provided on the lower surface of the insulating base portion, located between the first lower surface conductor and the second lower surface conductor in the lengthwise direction, and separated from each other. The resistor body is provided on the lower surface of the insulating base portion and located between the first lower surface conductor and the second lower surface conductor in the lengthwise direction. The third lower surface conductor and the fourth lower surface conductor are connected to the resistor body.

In a preferred embodiment of the present invention, the third lower surface conductor and the fourth lower surface conductor are separated from each other in a widthwise direction orthogonal or substantially orthogonal to the heightwise direction and the lengthwise direction.

In a preferred embodiment of the present invention, the resistor device further includes a protective film which covers the resistor body.

In a preferred embodiment of the present invention, at least one of the first end surface connection conductor and the second end surface connection conductor entirely covers or substantially entirely covers a corresponding one of the pair of end surfaces of the insulating base portion.

In a preferred embodiment of the present invention, the resistor body has a thickness of about 1 nm or more and about 10 nm or less, for example.

In a preferred embodiment of the present invention, at least one of the first end surface connection conductor and the second end surface connection conductor includes a surface that is at least partially covered with a protective film.

In a preferred embodiment of the present invention, the insulating base portion includes alumina.

According to preferred embodiments of the present invention, a resistor element and a capacitor element with desired electrical characteristics are able to be easily combined together, and thus a composite electronic component designed with an increased degree of design and manufacturing freedom and a resistor device of the composite electronic component are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described hereinafter in detail with reference to drawings. In the following preferred embodiments, repeated description is not provided for identical or common components or elements that are identically denoted in the figures.

Figure 1:
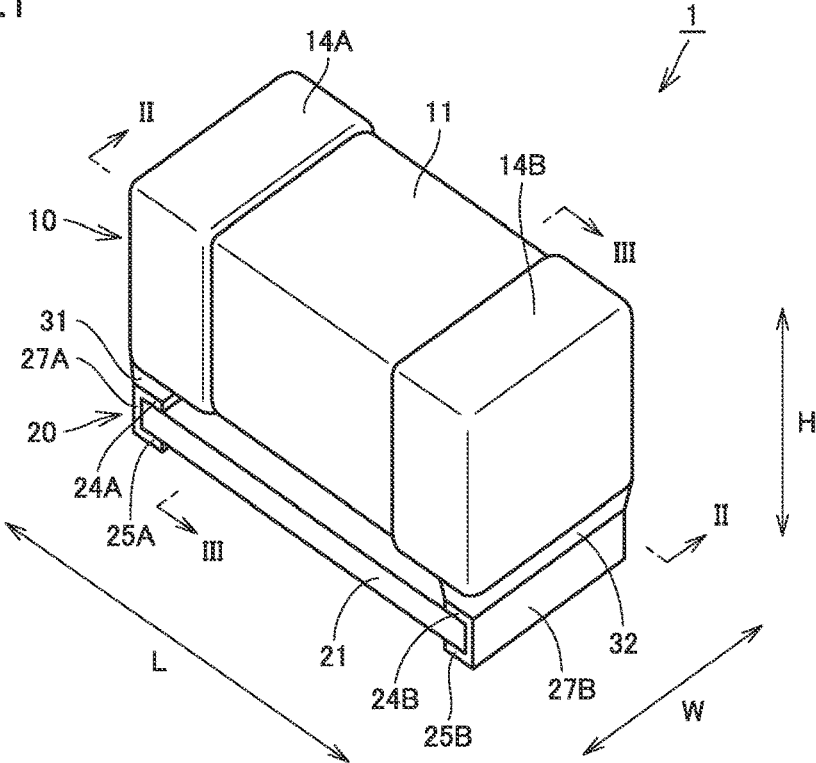
FIG. 1 is a perspective view of a composite electronic component according to a preferred embodiment of the present invention.
Figure 2:
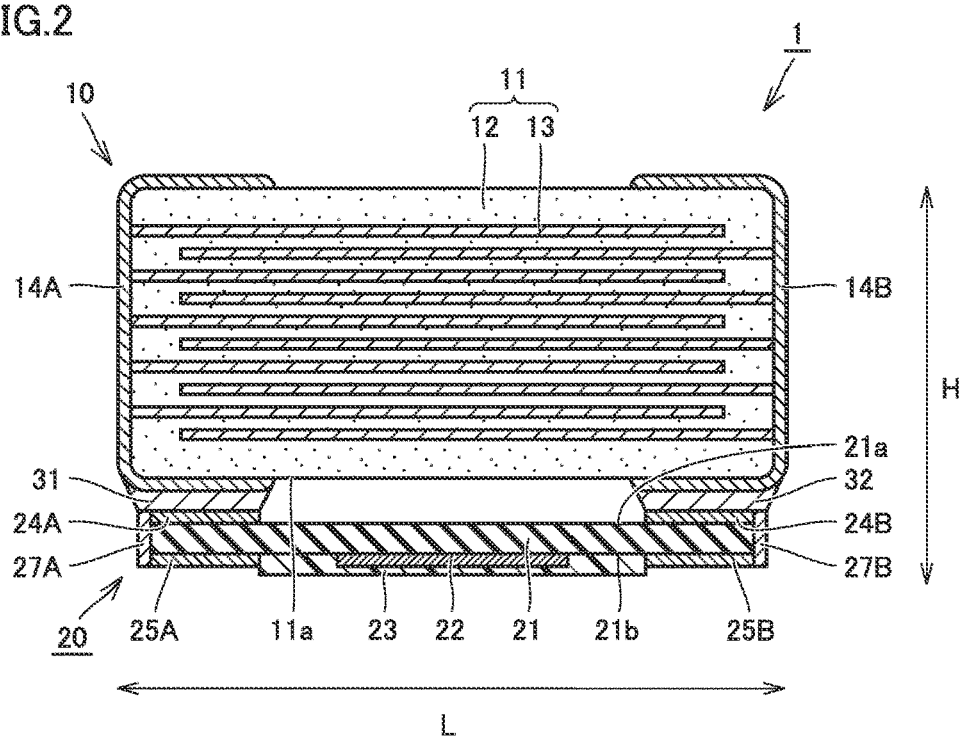
FIG. 2 is a cross-sectional view of the composite electronic component of FIG. 1 as seen in a direction of an arrow II-II of FIG. 1.
Figure 3:
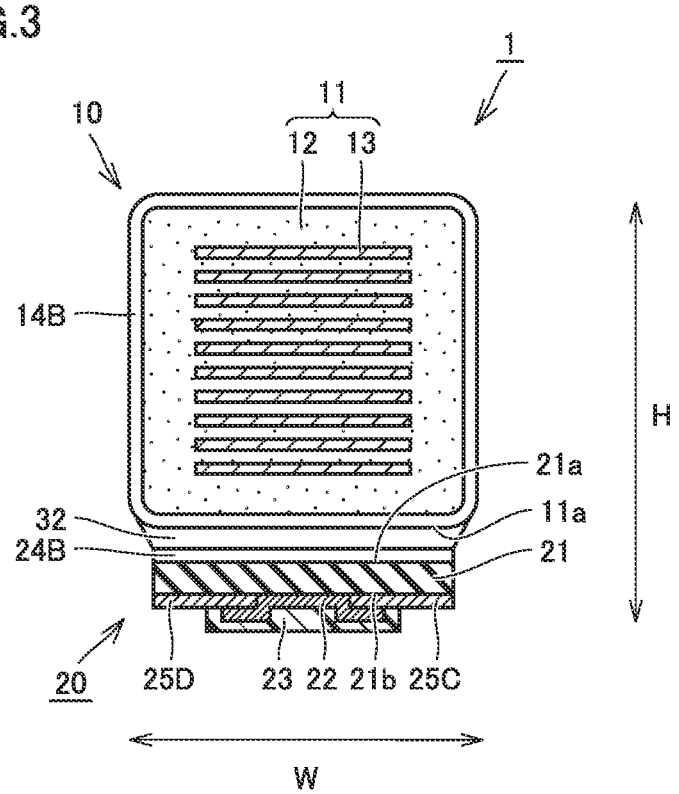
FIG. 3 is a cross-sectional view of the composite electronic component of FIG. 1 as seen in a direction of an arrow III-III of FIG. 1.
Figure 4:
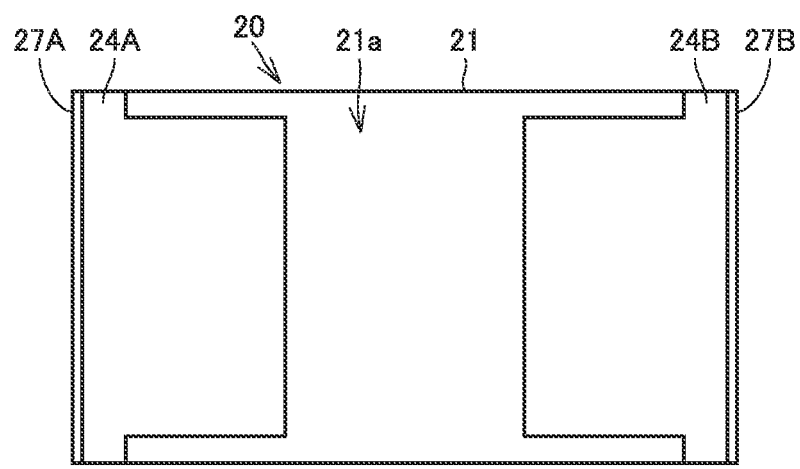
FIG. 4 is a top view of a resistor device of a composite electronic component according to a preferred embodiment of the present invention.
Figure 5:
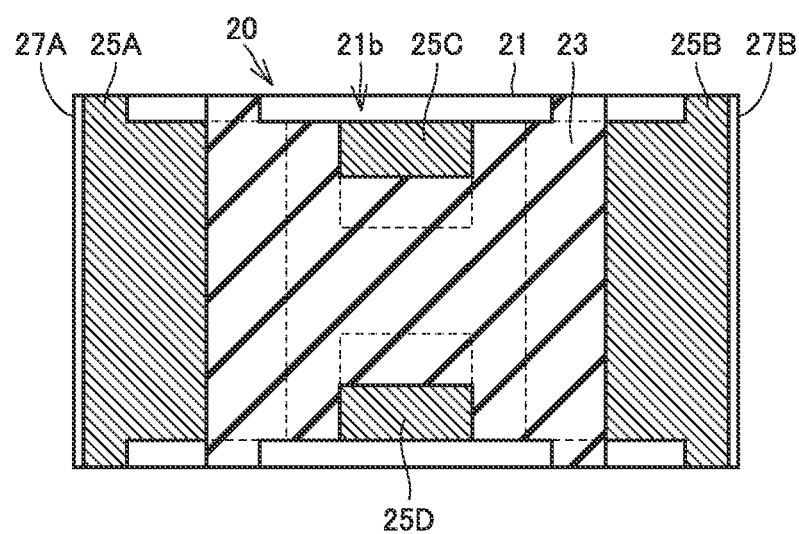
FIG. 5 is a bottom view of the resistor device of a composite electronic component according to a preferred embodiment of the present invention.
Figure 6:
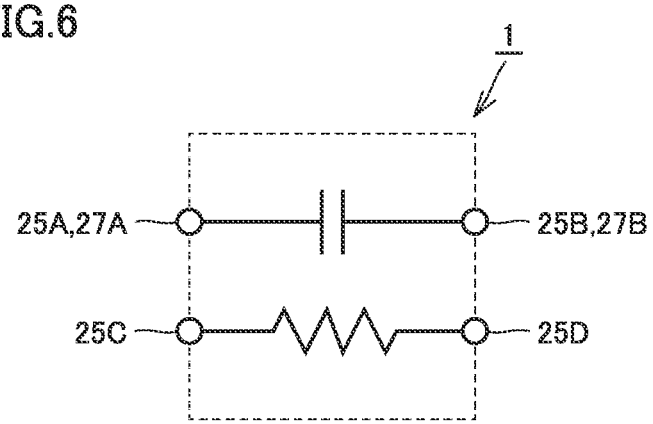
FIG. 6 shows an equivalent circuit of a composite electronic component according to a preferred embodiment of the present invention.

FIG. 1 is a perspective view of a composite electronic component according to a preferred embodiment of the present invention. FIG. 2 is a cross-sectional view of the composite electronic component of FIG. 1 as seen in a direction of an arrow II-II. FIG. 3 is a cross-sectional view of the composite electronic component of FIG. 1 as seen in a direction of an arrow III-III. FIG. 4 is a top view of a resistor device of the composite electronic component according to a preferred embodiment of the present invention. FIG. 5 is a bottom view of the resistor device of the composite electronic component according to a preferred embodiment of the present invention. FIG. 6 shows an equivalent circuit of the composite electronic component according to a preferred embodiment of the present invention.

As shown in FIGS. 1-6, a composite electronic component 1 according to a preferred embodiment includes a capacitor device 10 and a resistor device 20, and has a rectangular parallelepiped or a substantially rectangular parallelepiped shape.

The capacitor device 10 preferably has a rectangular parallelepiped or a substantially rectangular parallelepiped shape, and a length of the capacitor device 10 in a lengthwise direction L is longer than a width of the capacitor device 10 in a widthwise direction W, as described below. The rectangular parallelepiped or substantially rectangular parallelepiped shape as referred to herein includes capacitor device 10 with a corner and a ridge rounded, capacitor device 10 with an external surface provided with a step, a projection and a depression, and the like.

The resistor device 20 preferably has an elongated flat plate structure, and a length of the resistor device 20 in the lengthwise direction L is larger than a width of the resistor device 20 in the widthwise direction W, as described below. The flat plate as referred to herein includes resistor device 20 with a corner and a ridge rounded, resistor device 20 with an external surface provided with a step, a projection and a depression, and the like.

The capacitor device 10 is disposed on resistor device 20 and bonded to resistor device 20 via first and second bonding portions 31 and 32, which are, for example, a soldering bonding material, a conductive adhesive agent or a similar conductive bonding material, or the like. However, the method of bonding capacitor device 10 and resistor device 20 together is not limited to the bonding method with the conductive bonding materials described above, and different bonding methods may instead be implemented.

Herein, as terms indicating directions of composite electronic component 1, a direction in which capacitor device 10 and resistor device 20 are aligned is defined as a heightwise direction H, a direction orthogonal or substantially orthogonal to heightwise direction H in which capacitor device 10 includes a first external electrode 14A and a second external electrode 14B are aligned is defined as a lengthwise direction L, and a direction which is orthogonal or substantially orthogonal to both heightwise direction H and lengthwise direction L is defined as a widthwise direction W. The heightwise direction H, the lengthwise direction L, and the widthwise direction W are referred to below in the following description.

As shown in FIG. 1 to FIG. 3, capacitor device 10 is, for example, a multilayer ceramic capacitor including a capacitor body 11, first external electrode 14A, and second external electrode 14B. Capacitor body 11 preferably has a rectangular parallelepiped or a substantially rectangular parallelepiped shape, and first external electrode 14A and second external electrode 14B, which are provided on the capacitor body 11 as films, are separated from each other.

The capacitor body 11 includes a plurality of dielectric layers 12 and a plurality of internal electrode layers 13 alternately stacked. In the present preferred embodiment, the plurality of dielectric layers 12 and the plurality of internal electrode layers 13 are stacked in a direction that corresponds to a heightwise direction H. However, the plurality of dielectric layers 12 and the plurality of internal electrode layers 13 may instead be stacked in a widthwise direction W, for example.

Dielectric layer 12 includes a ceramic material with barium titanate ($BaTiO_3$), calcium titanate ($CaTiO_3$), strontium titanate ($SrTiO_3$), calcium zirconate ($CaZrO_3$) or the like as a major component, for example. Furthermore, dielectric layer 12 may include Mn, Mg, Si, Co, Ni, a rare earth element, or the like as a secondary component. Internal electrode layer 13 includes, for example, Ni, Cu, Ag, Pd, an Ag—Pd alloy, Au, or a similar metal material.

Each of the first external electrode 14A and second external electrode 14B includes a conductive film and, for example, includes a multilayer film of a sintered metal layer and a plating layer. The sintered metal layer is preferably formed by baking a paste of Cu, Ni, Ag, Pd, an Ag—Pd alloy, Au, or the like, for example. The plating layer includes a Ni plating layer and a Sn plating layer that covers the Ni plating layer, for example. However, the plating layer may instead be a Cu plating layer, an Au plating layer, or the like, for example. Furthermore, first external electrode 14A and second external electrode 14B may each include a plating layer alone or a conductive resin paste including a metal component and a resin component and cured, for example.

The capacitor body 11 includes a pair of end surfaces that are opposite to each other in the lengthwise direction L, a pair of side surfaces that are opposite to each other in the widthwise direction W, and a pair of main surfaces that are opposite to each other in the heightwise direction H. The main surfaces opposite in the heightwise direction H include a lower surface 11a that faces resistor device 20.

Furthermore, first external electrode 14A is provided to extend from one end surface of capacitor body 11 to the pair of side surfaces and the pair of main surfaces continuously or substantially continuously, and second external electrode 14B is provided to extend from the other end surface of capacitor body 11 to the pair of side surfaces and the pair of main surfaces continuously or substantially continuously. Thus, lower surface 11a of capacitor body 11 is covered with first external electrode 14A and second external electrode 14B separated from each other in the lengthwise direction L and exposed between first external electrode 14A and second external electrode 14B.

As shown in FIG. 2, a pair of internal electrode layers 13, which are adjacent to or in a vicinity of each other in the heightwise direction H with dielectric layer 12 located therebetween, includes one internal electrode layer 13 electrically connected inside capacitor device 10 to one of first external electrode 14A and second external electrode 14B, and the other internal electrode layer 13 electrically connected inside capacitor device 10 to the other of first external electrode 14A and second external electrode 14B. Thus, between first external electrode 14A and second external electrode 14B, a plurality of capacitor elements (C) are connected electrically in parallel.

Capacitor device 10 described above is produced, for example, as described below. A plurality of material sheets, each of which is a ceramic sheet, for example, a "green sheet", which will define and function as dielectric layer 12, including a surface with a conductive paste, which will define and function as internal electrode layer 13, printed thereon, are prepared. The material sheets are stacked, pressed together, and fired to produce capacitor body 11. Subsequently, first external electrode 14A and second external electrode 14B are formed on an external surface of capacitor body 11 to produce capacitor device 10. However, for example, an assembly in which a plurality of capacitor bodies 11 are integrated may be produced and then cut to produce the plurality of capacitor bodies 11 collectively, and subsequently, for each individual capacitor body 11, first external electrode 14A and second external electrode 14B may be formed.

As shown in FIG. 1 to FIG. 5, resistor device 20 includes an insulating base portion 21, a resistor body 22, a protective film 23, a first upper surface conductor 24A, a second upper surface conductor 24B, a first lower surface conductor 25A, a second lower surface conductor 25B, a third lower surface conductor 25C, a fourth lower surface conductor 25D, a first end surface connection conductor 27A, and a second end surface connection conductor 27B.

Base portion 21 preferably is formed as a flat plate and includes, for example, epoxy resin or a similar resin material, alumina or a similar ceramic material, or one or more of these materials with a filler, woven fabric, or the like of an inorganic material or an organic material added thereto. Preferably, a ceramic substrate including an alumina substrate and a low temperature co-fired ceramics (LTCC) substrate is used as base portion 21, for example.

Base portion 21 includes a pair of end surfaces that are opposite to each other in the lengthwise direction L, a pair of side surfaces that are opposite to each other in the widthwise direction W, and a pair of main surfaces that are opposite to each other in the heightwise direction H. The pair of main surfaces includes an upper surface 21a facing capacitor device 10 and a lower surface 21b defining and functioning as amounting surface facing an interconnect substrate on which composite electronic component 1 is mounted.

As shown in FIG. 2 and FIG. 3, resistor body 22 is provided on the base portion 21 lower surface 21b at a prescribed position and is formed, for example, in a rectangular or substantially rectangular film in a plan view. As resistor body 22, for example, a metal coating, a metal oxide coating, a metal glaze coating that is a mixture of the metal oxide coating and glass, or the like is able to be used. Preferably, resistor body 22 has a thickness of about 1 nm or more and about 10 nm or less, for example.

Protective film 23 covers at least a portion of resistor body 22 on lower surface 21b of base portion 21, and includes, for example, an insulating film including a glass material, a resin material, or the like. Preferably, protective film 23 completely covers resistor body 22 so that resistor body 22 is not externally exposed, for example. In the present preferred embodiment, protective film 23 covers a portion of each of first lower surface conductor 25A, second lower surface conductor 25B, third lower surface conductor 25C, and fourth lower surface conductor 25D. For clarity, in FIG. 5, resistor body 22 is not shown.

First upper surface conductor 24A and second upper surface conductor 24B are each provided on upper surface 21a of base portion 21 and include a rectangular or substantially rectangular conductive film. First upper surface conductor 24A and second upper surface conductor 24B are separated from each other in the lengthwise direction L and disposed at opposite ends in the lengthwise of upper surface 21a of base portion 21 in the lengthwise direction L.

To significantly reduce or prevent first lower surface conductor 25A, second lower surface conductor 25B, third lower surface conductor 25C, and fourth lower surface conductor 25D from peeling off base portion 21, it is preferable that first lower surface conductor 25A, second lower surface conductor 25B, third lower surface conductor 25C, and fourth lower surface conductor 25D each include at least a portion buried in base portion 21, for example. In particular, to significantly reduce or prevent first upper surface conductor 24A and second upper surface conductor 24B from peeling off base portion 21 due to a bonding strength exerted when capacitor device 10 is bonded, it is preferable that first upper surface conductor 24A and second upper surface conductor 24B each include at least a portion buried in base portion 21, for example.

First lower surface conductor 25A and second lower surface conductor 25B are each provided on lower surface 21b of base portion 21 and include a rectangular or substantially rectangular conductive film. First lower surface conductor 25A and second lower surface conductor 25B are separated from each other in the lengthwise direction L and disposed at opposite ends of lower surface 21b of base portion 21 in the lengthwise direction L.

Third lower surface conductor 25C and fourth lower surface conductor 25D are each provided on lower surface 21b of base portion 21 and include a rectangular or substantially rectangular conductive film. Third lower surface conductor 25C and fourth lower surface conductor 25D are located between first lower surface conductor 25A and second lower surface conductor 25B in the lengthwise direction L. Furthermore, third lower surface conductor 25C and fourth lower surface conductor 25D are separated from each other in the widthwise direction W and disposed at opposite ends in the widthwise direction of lower surface 21b of base portion 21 in the widthwise direction W.

First end surface connection conductor 27A covers one of the pair of end surfaces of base portion 21 in the lengthwise direction L and connects first upper surface conductor 24A and first lower surface conductor 25A. Second end surface connection conductor 27B covers the other of the pair of end surfaces of base portion 21 in the lengthwise direction L and connects second upper surface conductor 24B and second lower surface conductor 25B.

Although first upper surface conductor 24A, second upper surface conductor 24B, first lower surface conductor 25A, second lower surface conductor 25B, third lower surface conductor 25C, fourth lower surface conductor 25D, first end surface connection conductor 27A, and second end surface connection conductor 27B are able to include various types of conductive materials, preferably, for example, first end surface connection conductor 27A and second end surface connection conductor 27B include a metal material, for example, Cu, Ni, and/or Sn, and are formed by plating, baking a conductive paste, sputtering, or the like.

While in the present preferred embodiment, first end surface connection conductor 27A and second end surface connection conductor 27B each cover entirely or substantially entirely a corresponding one of the pair of end surfaces of base portion 21, only one of first end surface connection conductor 27A and second end surface connection conductor 27B may cover entirely or substantially entirely a corresponding one of the pair of end surfaces of base portion 21, for example.

At least one of first end surface connection conductor 27A and second end surface connection conductor 27B may include a surface at least partially covered with the protective film. Accordingly, a fillet formed when mounting composite electronic component 1 is able to be reduced to reduce a footprint of composite electronic component 1.

As shown in FIG. 3, resistor body 22 includes one end in the widthwise direction W covering a portion of third lower surface conductor 25C and the other end in the widthwise direction W covering a portion of fourth lower surface conductor 25D. Thus, third lower surface conductor 25C and fourth lower surface conductor 25D are able to be connected to resistor body 22.

Resistor device 20 described above is able to be produced, for example, by a procedure described below.

A conductive paste is printed and baked on upper surface 21a and lower surface 21b of base portion 21, or a metal material is sputtered and thus deposited on upper surface 21a and lower surface 21b of base portion 21, or the like to form first upper surface conductor 24A, second upper surface conductor 24B, first lower surface conductor 25A, second lower surface conductor 25B, third lower surface conductor 25C, and fourth lower surface conductor 25D.

Subsequently, a conductive paste is applied to and cured on the pair of end surfaces of base portion 21 and the pair of side surfaces of base portion 21, or a plating layer is formed on the pair of end surfaces of base portion 21 and the pair of side surfaces of base portion 21, or the like to form first end surface connection conductor 27A and second end surface connection conductor 27B.

Subsequently, a material to define and function as resistor body 22 is formed on lower surface 21b of base portion 21 by printing or the like to connect resistor body 22 to third lower surface conductor 25C and fourth lower surface conductor 25D.

Subsequently, a glass material, a resin material, or the like is applied to lower surface 21b of base portion 21, for example, by printing or the like to cover resistor body 22 and form protective film 23.

Thus, resistor device 20 as described above is produced. However, the procedure described above is only one example, and the order of each step in the above described procedure may be partially replaced or each component may be formed by a method other than the method described above. Furthermore, an assembly in which a plurality of resistor devices 20 are integrated may be produced and then cut to collectively produce the plurality of resistor devices 20.

As shown in FIG. 1 and FIG. 2, in composite electronic component 1 of the present preferred embodiment, as discussed above, capacitor device 10 and resistor device 20 are preferably bonded via first bonding portion 31 and second bonding portion 32.

More specifically, capacitor device 10 is mounted in the heightwise direction H on the side of upper surface 21a of resistor device 20, and lower surface 11a of capacitor body 11 and upper surface 21a of base portion 21 face each other in the heightwise direction H. First external electrode 14A of capacitor device 10 and first upper surface conductor 24A of resistor device 20 are bonded by first bonding portion 31. Second external electrode 14B of capacitor device 10 and second upper surface conductor 24B of resistor device 20 are bonded by second bonding portion 32.

Thus, first external electrode 14A and first upper surface conductor 24A are able to be electrically be connected, first end surface connection conductor 27A connected to first upper surface conductor 24A are able to define and function as a relay conductor of capacitor device 10, and first external electrode 14A and first lower surface conductor 25A are able to be electrically connected. Furthermore, second external electrode 14B and second upper surface conductor 24B are able to be electrically be connected, second end surface connection conductor 27B connected to second upper surface conductor 24B are able to define and function as a relay conductor of capacitor device 10, and second external electrode 14B and second lower surface conductor 25B are able to be electrically connected.

Accordingly, first lower surface conductor 25A, second lower surface conductor 25B, first end surface connection conductor 27A, and second end surface connection conductor 27B of resistor device 20 are able to define and function as a terminal conductor which is a connection terminal of capacitor device 10 to the interconnect substrate.

Resistor body 22 of resistor device 20 is electrically connected to third lower surface conductor 25C and fourth lower surface conductor 25D of resistor device 20, as described above.

Accordingly, third lower surface conductor 25C and fourth lower surface conductor 25D of resistor device 20 are able to define and function as a terminal conductor which is a connection terminal of resistor device 20 to the interconnect substrate.

Thus, composite electronic component 1 in the present preferred embodiment includes four terminal conductors defining and functioning as a connection terminal to the interconnect substrate and are able to provide an equivalent circuit as shown in FIG. 6.

By providing composite electronic component 1 with the configuration and features described above, it is not necessary to form a resistor body directly on a surface of a capacitor body. Accordingly, processing when producing composite electronic component 1 is able to be simplified and also electrical characteristics of the resistor body are able to be prevented from being constrained by the size of the capacitor body, the shape and size of a pair of external electrodes provided to the capacitor body, and the like. Accordingly, the composite electronic component is able to be more freely designed with reduced processing and sizing requirements.

Furthermore, by providing composite electronic component 1 of the configuration and features described above, it is not necessary to form capacitor device 10 and resistor device 20 with an identically or similarly shaped rectangular or substantially rectangular parallelepiped shape with equal or substantially equal dimensions, and capacitor device 10 and electrical characteristics of resistor device 20 are able to be prevented from being constrained by the shape and dimensions of the capacitor device 10. Accordingly, the composite electronic component is able to be more freely designed with significantly increased design and manufacturing freedom.

Furthermore, by providing composite electronic component 1 with the configuration and features described above, a resistor element (R) and a capacitor element (C) are electrically connected in parallel inside composite electronic component 1, and composite electronic component 1 is able to be more freely designed and manufactured with respect to its circuit configuration and features. That is, by electrically connecting the resistor element (R) and the capacitor element (C) on the side of the interconnect substrate on which composite electronic component 1 is mounted, the resistor element (R) and the capacitor element (C) are able to be connected either in series or in parallel. In addition, the resistor element (R) and the capacitor element (C) are preferably able to be connected to respective discrete circuits, for example. Accordingly, a composite electronic component according to the present preferred embodiment is able to be applied to various circuits.

In addition, by providing composite electronic component 1 with the configuration and features described above, a reduction in footprint size is able to be obtained by compositing capacitor device 10 and resistor device 20, that is, high integration of the electronic component on the interconnect substrate.

Preferably, with respect to reducing footprint size, a dimension of capacitor device 10 in the lengthwise direction L is preferably larger than a dimension of resistor device 20 in the lengthwise direction L, and a dimension of capacitor device 10 in the widthwise direction W is preferably larger than a dimension of resistor device 20 in the widthwise direction W, for example. Furthermore, to increase a capacitance of capacitor device 10, a dimension of capacitor device 10 in the heightwise direction H is preferably greater than a dimension of resistor device 20 in the heightwise direction H, for example.

As described above, in composite electronic component 1 of the present preferred embodiment and resistor device 20, a resistor element (R) and a capacitor element (C) with desired electrical characteristics are able to be easily combined together, which provides increased freedom in designing the composite electronic component and increased freedom in designing a circuit of an interconnect substrate on which the composite electronic component is mounted.

For example, if a plurality of types of capacitor devices 10 with different electrical characteristics are prepared and a plurality of types of resistor devices 20 with different electrical characteristics are prepared, then by selecting these and combining these devices a composite electronic component including a resistor element (R) and a capacitor element (C) with desired individual and/or combined electrical characteristics together is able to be easily produced. Preferably, it is not necessary to identically shape and equally dimension a plurality of types of capacitor devices and identically shape and equally dimension a plurality of types of resistor devices, and as long as a capacitor device of a selected type and a resistor device of a selected type are able to be superposed one on another and composited together, for example. That is, the plurality of types of capacitor devices are able to be differently shaped and dimensioned and the plurality of types of resistor devices are able to be differently shaped and dimensioned.

Figure 7:
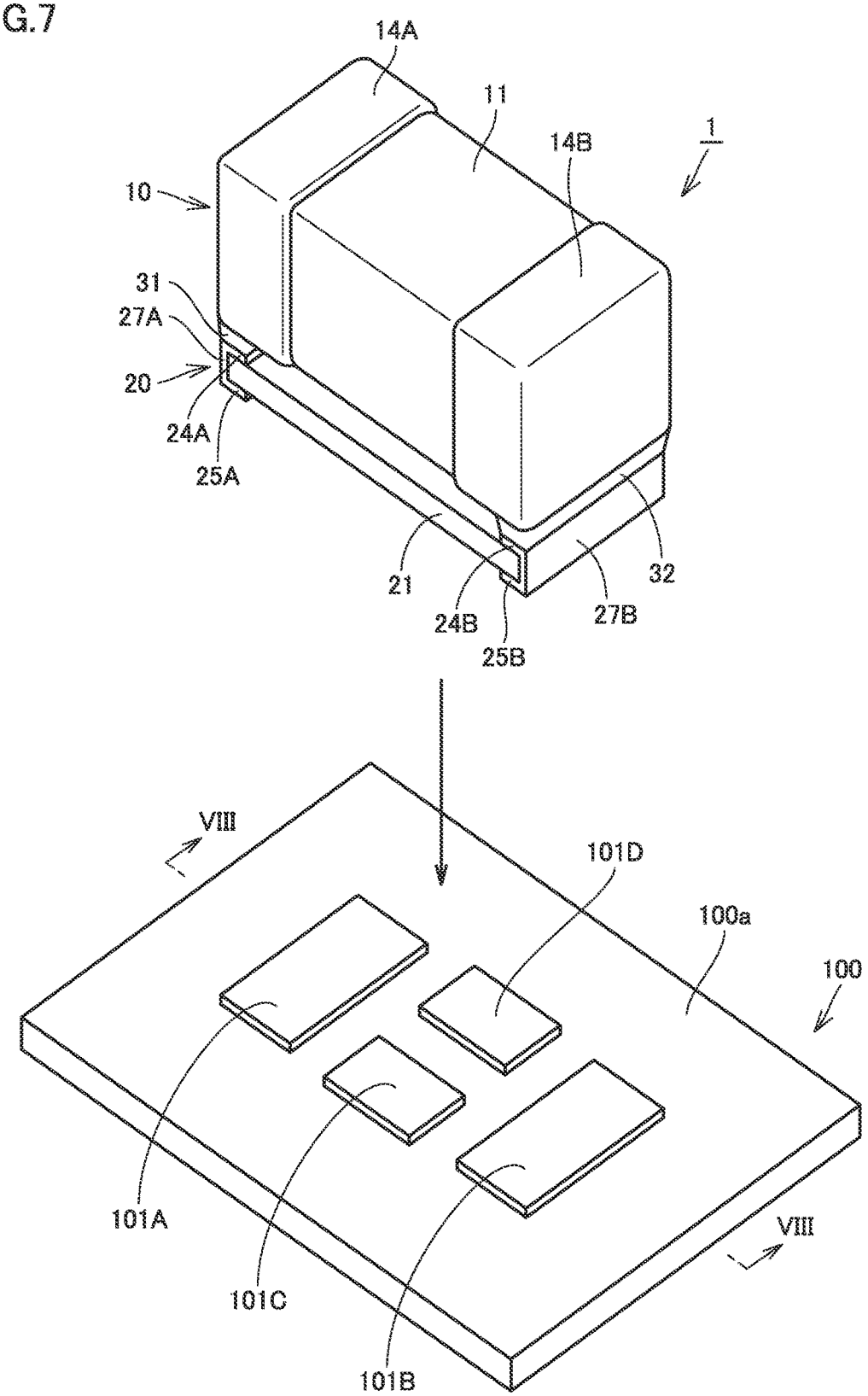
FIG. 7 is a perspective view showing a method of mounting the composite electronic component shown in FIG. 1 on an interconnect substrate.
Figure 8:
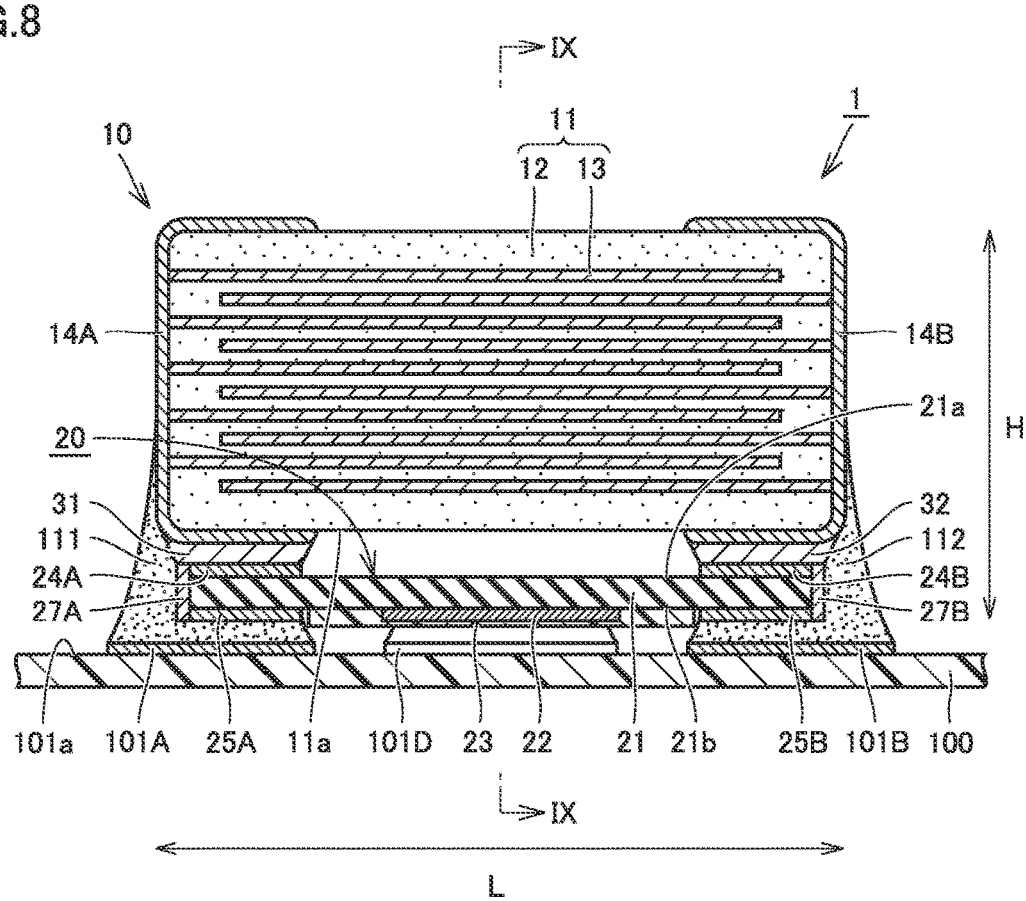
FIG. 8 is a cross-sectional view of a mounting structure including the composite electronic component shown in FIG. 7, as seen in a direction of an arrow VIII-VIII of FIG. 7.
Figure 9:
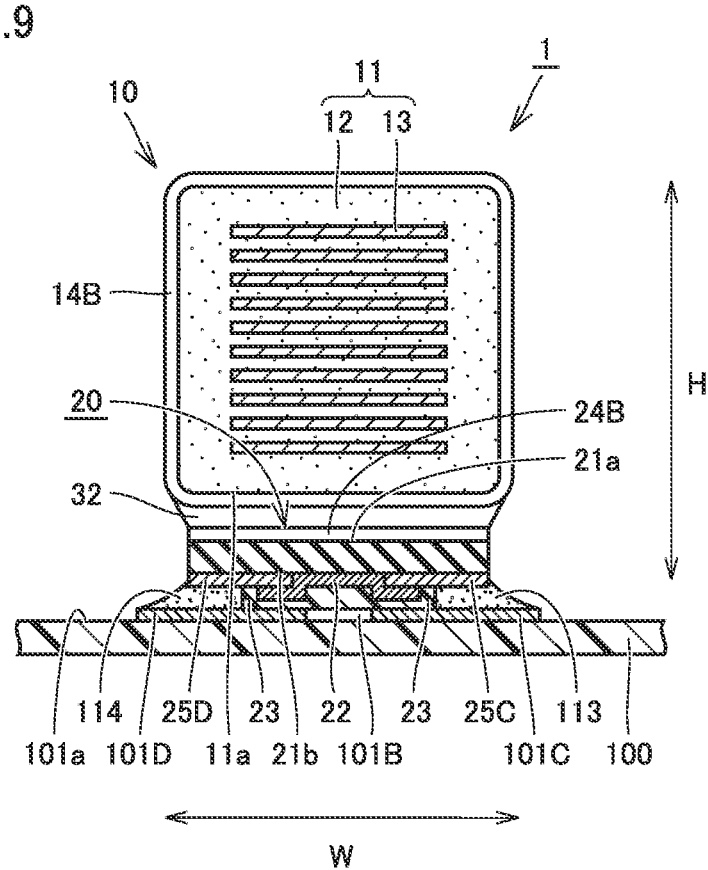
FIG. 9 is a cross-sectional view of the mounting structure including the composite electronic component, as shown in FIG. 8, as seen in a direction of an arrow IX-IX of FIG. 8.

FIG. 7 is a perspective view showing a method of mounting the composite electronic component shown in FIG. 1 on an interconnect substrate. FIG. 8 is a cross-sectional view of a mounting structure including the composite electronic component shown in FIG. 7, as seen in a direction of an arrow VIII-VIII. FIG. 9 is a cross-sectional view of the mounting structure including the composite electronic component, as shown in FIG. 8, as seen in a direction of an arrow IX-IX.

As shown in FIGS. 7-9, when mounting composite electronic component 1 on an interconnect substrate 100, lower surface 21b of base portion 21 of resistor device 20 faces a main surface 100a of interconnect substrate 100, and composite electronic component 1 is mounted by a soldering bonding material, a conductive adhesive agent or a similar conductive bonding material, or the like.

Interconnect substrate 100 is an insulating substrate including main surface 100a with a conduction pattern formed thereon, and as a material for interconnect substrate 100, epoxy resin or a similar resin material, alumina or a similar ceramic material, or one or more of these materials with a filler, woven fabric, or the like of an inorganic material or an organic material added thereto, are able to be included. Preferably, as interconnect substrate 100, a glass epoxy substrate including a base material of epoxy resin and glassy woven fabric added to the base material is included, for example.

On main surface 100a of interconnect substrate 100, a first land 101A, a second land 101B, a third land 101C, and a fourth land 101D are provided to correspond to composite electronic component 1. First land 101A, second land 101B, third land 101C, and fourth land 101D each correspond to a portion of the above-described conduction pattern and are separated from one another.

Furthermore, first land 101A, second land 101B, third land 101C, and fourth land 101D are sized to correspond to first lower surface conductor 25A, second lower surface conductor 25B, third lower surface conductor 25C, and fourth lower surface conductor 25D of composite electronic component 1, respectively, and to include portions facing first lower surface conductor 25A, second lower surface conductor 25B, third lower surface conductor 25C, and fourth lower surface conductor 25D, respectively, in a direction orthogonal or substantially orthogonal to main surface 100a of interconnect substrate 100. First land 101A, second land 101B, third land 101C, and fourth land 101D are able to each be formed using various types of conductive materials, for example, a metal material. Preferably, the metal material includes Cu, for example.

First lower surface conductor 25A, second lower surface conductor 25B, third lower surface conductor 25C, fourth lower surface conductor 25D, first end surface connection conductor 27A, and second end surface connection conductor 27B of composite electronic component 1 and first land 101A, second land 101B, third land 101C, and fourth land 101D provided on interconnect substrate 100 are bonded by a first mounting, bonding portion 111, a second mounting, bonding portion 112, a third mounting, bonding portion 113, and a fourth mounting, bonding portion 114, respectively, which include a conductive bonding material. Since composite electronic component 1 is provided with first end surface connection conductor 27A and second end surface connection conductor 27B, a fillet is able to be formed by the first mounting, bonding portion 111, and the second mounting, bonding portion 112, and composite electronic component 1 is able to be more stably mounted.

When prescribed ones of first land 101A, second land 101B, third land 101C, and fourth land 101D as described above are mutually electrically connected, capacitor device 10 and resistor device 20 included in composite electronic component 1 are able to be connected on the side of interconnect substrate 100 either in series or in parallel.

While the preferred embodiments of the present invention described above provide examples in which a dielectric layer and an internal electrode layer defining a capacitor body of a capacitor device are stacked in a direction matching a composite electronic component's heightwise direction, the stacking direction may be modified to match the composite electronic component's widthwise direction.

Furthermore, while in the preferred embodiments of the present invention described above provides an example in which a multilayer ceramic capacitor is used as a capacitor device incorporated in a composite electronic component, a capacitor device of a type other than the multilayer ceramic capacitor may be incorporated in the composite electronic component.

Furthermore, while the preferred embodiments of the present invention described above provide examples in which a multilayer ceramic capacitor is an example of an electronic component mounted on a resistor device, the electronic component mounted on the resistor device may be a capacitor device other than the multilayer ceramic capacitor or may be an inductor device, a thermistor device, a piezoelectric device, or a similar electronic component. When the inductor device is compared with the above-described multilayer ceramic capacitor, a conductor layer including a coil replaces the internal electrode layer, and thus includes the body, and a pair of external terminals of the conductor layer including the coil replaces the pair of external electrodes and is provided on a surface of the body.

While preferred embodiments of the present invention and modifications thereof have been described above, it is to be understood that variations and modifications will be apparent to those skilled in the art without departing from the scope and spirit of the present invention. The scope of the present invention, therefore, is to be determined solely by the following claims.

What is claimed is:
1. A composite electronic component comprising:
a resistor device; and
a capacitor device mounted on the resistor device in a heightwise direction; wherein
the resistor device includes:
an insulating base including an upper surface and a lower surface that are opposite to each other in the heightwise direction, and a pair of end surfaces that are opposite to each other in a lengthwise direction orthogonal or substantially orthogonal to the heightwise direction;

a resistor body provided on the insulating base;
a first upper surface conductor and a second upper surface conductor provided on the upper surface of the insulating base and separated from each other in the lengthwise direction;
a first lower surface conductor and a second lower surface conductor provided on the lower surface of the insulating base and separated from each other in the lengthwise direction;
a first end surface connection conductor provided on one of the pair of end surfaces of the insulating base and connecting the first upper surface conductor and the first lower surface conductor;
a second end surface connection conductor provided on the other of the pair of end surfaces of the insulating base and connecting the second upper surface conductor and the second lower surface conductor; and
a third lower surface conductor and a fourth lower surface conductor provided on the lower surface of the insulating base, located between the first lower surface conductor and the second lower surface conductor in the lengthwise direction, and separated from each other;
the capacitor device includes:
a capacitor body including a lower surface orthogonal or substantially orthogonal to the heightwise direction; and
a first external electrode and a second external electrode provided on an external surface of the capacitor body and separated from each other in the lengthwise direction;
the upper surface of the insulating base and the lower surface of the capacitor body face each other in the heightwise direction;
the first upper surface conductor and the first external electrode are electrically connected to each other;
the second upper surface conductor and the second external electrode are electrically connected to each other;
the resistor body is provided on the lower surface of the insulating base and located between the first lower surface conductor and the second lower surface conductor in the lengthwise direction; and
the third lower surface conductor and the fourth lower surface conductor are connected to the resistor body.

2. The composite electronic component according to claim 1, wherein the third lower surface conductor and the fourth lower surface conductor are separated from each other in a widthwise direction orthogonal or substantially orthogonal to the heightwise direction and the lengthwise direction.

3. The composite electronic component according to claim 1, further comprising a protective film covering the resistor device.

4. The composite electronic component according to claim 3, wherein the protective film completely covers the resistor device.

5. The composite electronic component according to claim 1, wherein at least one of the first end surface connection conductor and the second end surface connection conductor entirely covers or substantially entirely covers a corresponding one of the pair of end surfaces of the insulating base portion.

6. The composite electronic component according to claim 1, wherein the resistor body has a thickness of about 1 nm or more and about 10 nm or less.

7. The composite electronic component according to claim 1, wherein at least one of the first end surface connection conductor and the second end surface connection conductor includes a surface that is at least partially covered with a protective film.

8. The composite electronic component according to claim 1, wherein the insulating base portion includes alumina.

9. The composite electronic component according to claim 1, wherein at least one of the first external electrode and the second external electrode includes a conductive film.

10. The composite electronic component according to claim 1, wherein at least one of the first external electrode and the second external electrode includes a multilayer film of a sintered metal layer and a plating layer.

11. The composite electronic component according to claim 1, wherein the capacitor body includes a plurality of dielectric layers alternately stacked with a plurality of internal electrode layers.

12. The composite electronic component according to claim 1, wherein the resistor body includes a metal coating, a metal oxide coating, or a metal glaze coating that is a mixture of the metal oxide coating and glass.

13. The composite electronic component according to claim 1, wherein at least a portion of at least one of the first lower surface conductor, the second lower surface conductor, the third lower surface conductor, the fourth lower surface conductor, the first upper surface conductor, and the second upper surface conductor is buried in base portion.

14. A resistor device comprising:
an insulating base portion including an upper surface and a lower surface that are opposite to each other in a heightwise direction, and a pair of end surfaces that are opposite to each other in a lengthwise direction orthogonal or substantially orthogonal to the heightwise direction;
a resistor body provided on the insulating base;
a first upper surface conductor and a second upper surface conductor provided on the upper surface of the insulating base and separated from each other in the lengthwise direction;
a first lower surface conductor and a second lower surface conductor provided on the lower surface of the insulating base and separated from each other in the lengthwise direction;
a first end surface connection conductor provided on one of the pair of end surfaces of the insulating base and connecting the first upper surface conductor and the first lower surface conductor;
a second end surface connection conductor provided on the other of the pair of end surfaces of the insulating base and connecting the second upper surface conductor and the second lower surface conductor; and
a third lower surface conductor and a fourth lower surface conductor provided on the lower surface of the insulating base, located between the first lower surface conductor and the second lower surface conductor in the lengthwise direction, and separated from each other; wherein
the resistor body is provided on the lower surface of the insulating base and located between the first lower surface conductor and the second lower surface conductor in the lengthwise direction;
the third lower surface conductor and the fourth lower surface conductor are connected to the resistor body; and
the first upper surface conductor and the second upper surface conductor are not connected to any resistor body.

15. The resistor device according to claim 14, wherein the third lower surface conductor and the fourth lower surface conductor are separated from each other in a widthwise direction orthogonal or substantially orthogonal to the heightwise direction and the lengthwise direction.

16. The resistor device according to claim 14, further comprising a protective film covering the resistor body.

17. The resistor device according to claim 14, wherein at least one of the first end surface connection conductor and the second end surface connection conductor entirely covers or substantially entirely covers a corresponding one of the pair of end surfaces of the insulating base portion.

18. The resistor device according to claim 14, wherein the resistor body has a thickness of about 1 nm or more and about 10 nm or less.

19. The resistor device according to claim 14, wherein at least one of the first end surface connection conductor and the second end surface connection conductor includes a surface that is at least partially covered with a protective film.

20. The resistor device according to claim 14, wherein the insulating base portion includes alumina.

\* \* \* \* \*